United States Patent
Nonaka et al.

(10) Patent No.: US 12,400,909 B2
(45) Date of Patent: Aug. 26, 2025

(54) METHOD FOR PRODUCING SUPPORT SUBSTRATE FOR BONDED WAFER, AND SUPPORT SUBSTRATE FOR BONDED WAFER

(71) Applicant: SUMCO CORPORATION, Tokyo (JP)

(72) Inventors: Naoya Nonaka, Tokyo (JP); Daisuke Hieda, Tokyo (JP); Hiroaki Ishizaki, Tokyo (JP); Toshiyuki Isami, Nagasaki (JP); Koudai Moroiwa, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 18/032,247

(22) PCT Filed: Oct. 18, 2021

(86) PCT No.: PCT/JP2021/038375
§ 371 (c)(1),
(2) Date: Apr. 17, 2023

(87) PCT Pub. No.: WO2022/091831
PCT Pub. Date: May 5, 2022

(65) Prior Publication Data
US 2023/0395423 A1 Dec. 7, 2023

(30) Foreign Application Priority Data

Oct. 26, 2020 (JP) ................. 2020-179040

(51) Int. Cl.
*H01L 21/304* (2006.01)
*C23C 16/24* (2006.01)
(Continued)

(52) U.S. Cl.
CPC ........ *H01L 21/76254* (2013.01); *C23C 16/24* (2013.01); *C23C 16/56* (2013.01)

(58) Field of Classification Search
CPC .................................................... H01L 21/304
See application file for complete search history.

(56) References Cited

U.S. PATENT DOCUMENTS 6,559,040 B1   5/2003   Yu et al.
2005/0186736 A1   8/2005   Joo
(Continued)

FOREIGN PATENT DOCUMENTS

JP    2000-200741 A    7/2000
JP    2005-236247 A    9/2005
(Continued)

OTHER PUBLICATIONS

English Translation of JP2017-228686 from EPO dated Oct. 19, 2024 (14 pages) (Year: 2024).*
(Continued)

*Primary Examiner* — Adam Krupicka
(74) *Attorney, Agent, or Firm* — GREENBLUM & BERNSTEIN, P.L.C.

(57) ABSTRACT

A producing method of a handle wafer for a bonded wafer produced by bonding an active wafer and the handle wafer through an insulation film includes: preparing a handle wafer body made from a monocrystalline silicon wafer; forming an oxide film on the handle wafer body; depositing a polycrystalline silicon layer on the oxide film; forming a protective oxide film on a surface of the polycrystalline silicon layer; and polishing to remove the protective oxide film and polishing the polycrystalline silicon layer.

5 Claims, 2 Drawing Sheets

(51) Int. Cl.
*C23C 16/56* (2006.01)
*H01L 21/762* (2006.01)

(56) References Cited

U.S. PATENT DOCUMENTS

2007/0024156 A1* 2/2007 Li .................... B81B 3/0072
                                                                310/309
2017/0345663 A1    11/2017 Ishizuka et al.

FOREIGN PATENT DOCUMENTS

| JP | 2009-259855 A | 11/2009 |
| JP | 2017-84887 A  | 5/2017  |
| JP | 2017-228686 A | 12/2017 |

OTHER PUBLICATIONS

IPRP of International Patent Application No. PCT/JP2021/038375, May 2, 2023, translation.
International Search Report issued in WIPO Patent Application No. PCT/JP2021/038375, dated Dec. 14, 2021, along with an English translation thereof.
Search Report issued in EP Patent Application No. 21885950.2, Oct. 17, 2024.

* cited by examiner

METHOD FOR PRODUCING SUPPORT SUBSTRATE FOR BONDED WAFER, AND SUPPORT SUBSTRATE FOR BONDED WAFER

TECHNICAL FIELD

The present invention relates to a producing method of a handle wafer for a bonded wafer and a handle wafer for a bonded wafer.

BACKGROUND ART

Silicon On Insulator (SOI) wafers have been used as substrates for high-frequency (Radio Frequency (RF)) devices. The SOI wafers each include an insulation film made of, for instance, silicon oxide ($SiO_2$) and an active layer (e.g., monocrystalline silicon), which are sequentially layered on a handle wafer (e.g., a monocrystalline silicon wafer).

One of typical methods for producing the SOI wafers is a bonding method. In the bonding method, the insulation film is formed on at least one of the handle wafer or the active wafer, then these wafers are bonded through the insulation film and subsequently subjected to heat treatment at a high temperature of approximately 1,200 degrees C. to produce the SOI wafer (hereinafter, the SOI wafer produced by the bonding method is referred to as a "bonded wafer").

In order to address RF in the bonded wafer, the handle wafer has been increased in resistivity (for instance, to have a resistivity of 3000 Ω·cm or more). However, there is a demand for bonded wafers handling higher frequency in response to the need for higher-speed devices and this demand cannot be met only by increasing the resistivity of the handle wafer.

In view of the above, it has been proposed to provide, on a surface of the handle wafer, a polycrystalline silicon layer as a carrier trap layer that traps and annihilates carriers generated during a high-frequency operation (see, for instance, Patent Literature 1). In this method, in order to prevent epitaxial growth of silicon on the monocrystalline silicon of the handle wafer, an ultra-thin oxide film is formed on the handle wafer and polycrystalline silicon is formed on the ultra-thin oxide film. A surface provided with the polycrystalline silicon is polished and then bonded to an insulation film formed on the active layer.

CITATION LIST

Patent Literature(s)

Patent Literature 1: JP 2000-200741 A

SUMMARY OF THE INVENTION

Problem(s) to be Solved by the Invention

Here, the generation of void defects in the bonding step disadvantageously causes film peeling in the bonded wafer to decrease the yield in bonding. In this regard, Patent Literature 1 describes the technique of controlling a surface roughness of the polycrystalline silicon layer to be 1 nm or less in terms of a centerline average roughness Ra to inhibit the generation of void defects in heating for bonding, thereby attaining a required strength.

However, even in a case where the bonded wafers are produced through the above technique, void defects may be generated. Thus, further measures are desirably taken to improve the quality of the bonded wafers.

An object of the invention is to provide a producing method of a handle wafer for a bonded wafer, the handle wafer capable of inhibiting void defects in a bonding step, and to provide such a handle wafer for a bonded wafer.

Means for Solving the Problem(s)

According to an aspect of the invention, a producing method of a handle wafer for a bonded wafer produced by bonding an active wafer and the handle wafer through an insulation film includes: preparing a handle wafer body made from a monocrystalline silicon wafer; forming an oxide film on the handle wafer body; depositing a polycrystalline silicon layer on the oxide film; forming a protective oxide film on a surface of the polycrystalline silicon layer; and polishing to remove the protective oxide film and polishing the polycrystalline silicon layer.

In the production method of a handle wafer for a bonded wafer according to the above aspect of the invention, in the forming the protective oxide film, the protective oxide film may be formed through SC-1 cleaning.

In the production method of a handle wafer for a bonded wafer according to the above aspect of the invention, in the forming the protective oxide film, the protective oxide film may be formed through ozone passivation.

In the production method of a handle wafer for a bonded wafer according to the above aspect of the invention, the protective oxide film formed in the forming the protective oxide film may have a thickness in a range from 0.5 nm to 10 nm.

According to another aspect of the invention, a handle wafer for a bonded wafer produced by bonding an active wafer and the handle wafer through an insulation film includes: a handle wafer body; and a polycrystalline silicon layer deposited on the handle wafer body, in which a root-mean-square roughness Rq of a polished surface of the polycrystalline silicon layer, which is measured in an area of 10 μm×10 μm, is 0.5 nm or less, the polycrystalline silicon layer has a thickness in a range from 1.5 μm to 2.0 μm, and the number of pits of 2 nm or more detected in the surface of the polycrystalline silicon layer in a DIC mode of SP-1 produced by KLA-Tencor Corporation is 1 piece/cm 2 or less.

According to the above aspects of the invention, the generation of void defects in the bonding step can be inhibited with the handle wafer used for the bonded wafer produced by bonding the active wafer and the handle wafer through the insulation film.

DESCRIPTION OF EMBODIMENT(S)

Suitable exemplary embodiment(s) of the invention will be described in detail below with reference to the attached drawings. A handle wafer for a bonded wafer of the invention is, for instance, used for a bonded wafer (e.g., an SOI wafer), which is obtained by bonding the handle wafer to an insulation film formed on an active wafer.

Inventors of the invention have made dedicated studies on the handle wafer for the bonded wafer, the handle wafer capable of inhibiting the generation of void defects. As a result, it has been found that in polishing a polycrystalline silicon layer of the handle wafer, for instance, impurities (e.g., slurry residues) caused by a polishing apparatus adhere on the polycrystalline silicon layer and these impurities cause defects that are to be detected.

Specifically, it has been found that by polishing the polycrystalline silicon layer on which a minute amount of slurry residues adheres, a surface of the polycrystalline silicon layer is locally etched to generate pits (i.e., pit defects), so that these pits cause defects after the handle wafer is bonded to the active wafer. A production method of the handle wafer of the invention includes forming a protective oxide film for protecting the polycrystalline silicon layer in order to eliminate the effect of the impurities.

Figure 1:
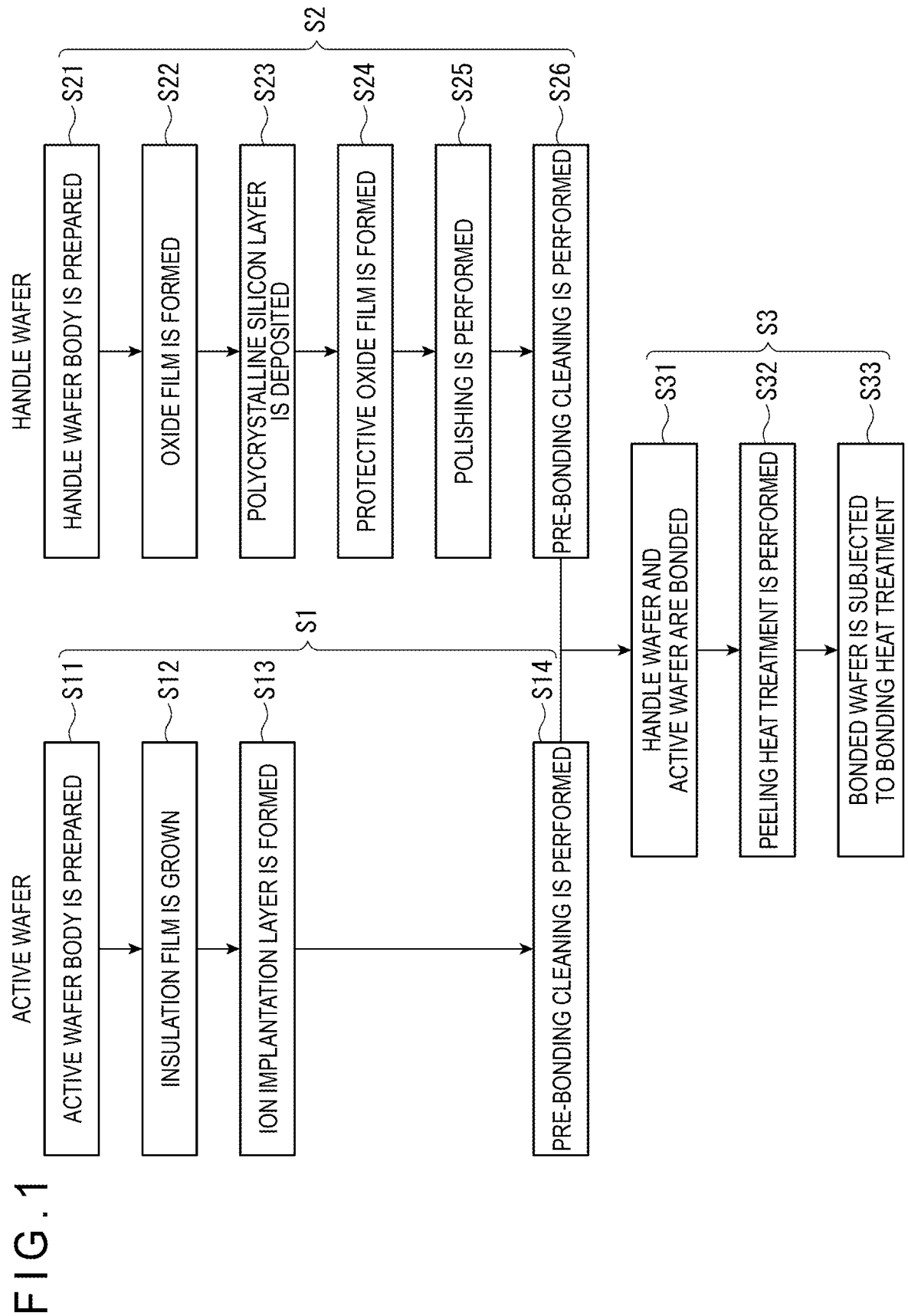
FIG. 1 is a flowchart for illustrating a process for producing a bonded wafer according to an exemplary embodiment of the invention.
Figure 2:
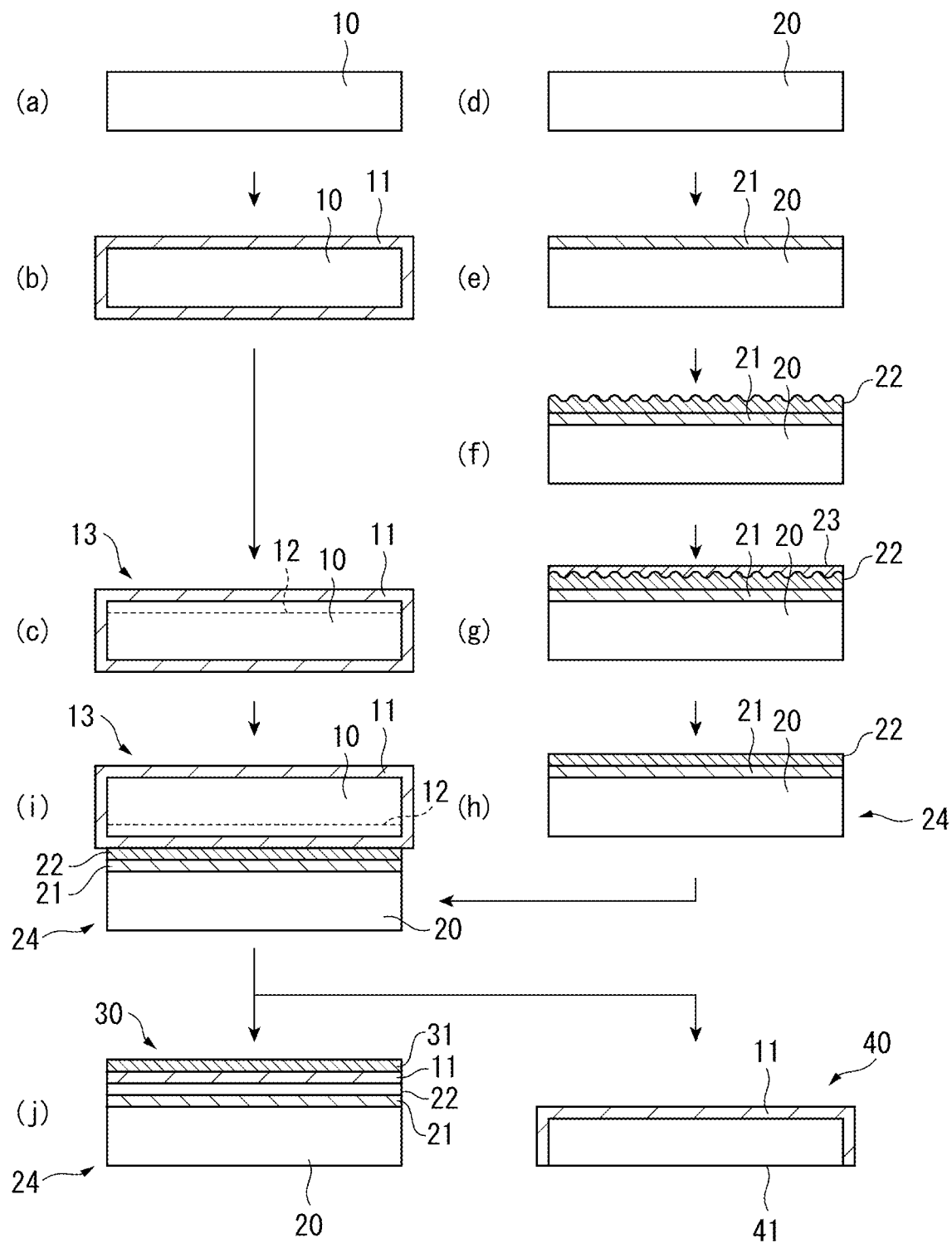
FIG. 2 is a cross-sectional view showing steps of a production method of the bonded wafer according to the exemplary embodiment of the invention.

FIG. 1 is a flowchart for illustrating a process for producing the bonded wafer of the exemplary embodiment. FIG. 2 is a cross-sectional view showing steps of the production method of the bonded wafer.

As shown in FIG. 1, the production method of the bonded wafer includes an active wafer production step S1 for producing the active wafer, a handle wafer production step S2 for producing the handle wafer (i.e., the production method of the handle wafer), which is independent of the active wafer production step S1, and a bonded wafer production step S3 for producing the bonded wafer by bonding the active wafer and the handle wafer.

The active wafer production step S1 includes an active wafer body preparation step S11, an insulation film growth step S12, an ion implantation layer formation step S13, and a pre-bonding cleaning step S14.

In the active wafer body preparation step S11, an active wafer body 10 in a form of a monocrystalline silicon wafer is prepared as shown in FIG. 2(a). In the insulation film growth step S12, an insulation film 11 (i.e., an oxide film) is grown around the active wafer body 10 through, for instance, thermal oxidation, CVD or the like as shown in FIG. 2(b).

In the ion implantation layer formation step S13, an ion implantation layer 12 is formed in the active wafer body 10 by implanting hydrogen ion or rare gas ion from above the insulation film 11 using an ion implanter.

In the pre-bonding cleaning step S14, the active layer is cleaned before being bonded in order to remove particles on a bonding surface of the active wafer body 10.

The active wafer 13 for the bonded wafer is produced through the above steps.

The handle wafer production step S2 includes a handle wafer body preparation step S21, an oxide film formation step S22, a polycrystalline silicon layer deposition step S23, a protective oxide film formation step S24, a polishing step S25, and a pre-bonding cleaning step S26.

In the handle wafer body preparation step S21, a handle wafer body 20 made from a monocrystalline silicon wafer is prepared as shown in FIG. 2(d). The monocrystalline silicon wafer to be used may be produced by slicing a monocrystalline silicon ingot, which is grown by a Czochralski method (CZ method) or floating zone melting method (FZ method), using a wire saw or the like.

In the oxide film formation step S22, an oxide film 21 is formed on a bonding surface of the handle wafer body 20 as shown in FIG. 2(e). Preferably, the thickness of the oxide film 21 is, for instance, in a range from 0.3 nm to 10 nm. With the reduced thickness of the oxide film 21, the oxide film 21 interposed between the handle wafer body 20 and a later-described polycrystalline silicon layer 22 hardly affects properties of the RF device.

The oxide film 21 may be formed through, for instance, wet cleaning such as alkali cleaning (SC-1 cleaning) or acid cleaning (SC-2 cleaning). The oxide film 21 may be formed by any other method, for example, by thermal oxidation under an oxidative atmosphere or oxidation heat treatment using a rapid heating/cooling device.

In the polycrystalline silicon layer deposition step S23, a polycrystalline silicon layer 22 is deposited on the oxide film 21 formed on the bonding surface of the handle wafer body 20 as shown in FIG. 2(f). The polycrystalline silicon layer 22 may be deposited through, for instance, a CVD method. Preferably, the thickness of the polycrystalline silicon layer 22 is in a range from 2 μm to 4 μm.

The protective oxide film formation step S24 is a step of forming, on a surface of the polycrystalline silicon layer 22, a protective oxide film 23 serving as a protective film, as shown in FIG. 2(g). Preferably, the thickness of the protective oxide film 23 is, for instance, in a range from 0.5 nm to 10 nm. With the thickness of the protective oxide film 23 being less than 0.5 nm, the protective oxide film 23 cannot exhibit the effect as a protective film. With the thickness of the protective oxide film 23 being more than 10 nm, time required for polishing in the polishing step S25 increases, leading to a high production cost.

In order to attain a balance between the effect as a protective film and the production cost, the thickness of the protective oxide film 23 is more preferably in a range from 0.7 nm to 2 nm.

The protective oxide film 23 is formed through alkali cleaning (SC-1 cleaning). Specifically, in the protective oxide film formation step S24, an oxide film is formed on the surface of the polycrystalline silicon layer 22 by cleaning the surface of the polycrystalline silicon layer 22 with an aqueous solution of $NH_4OH$ (ammonium hydroxide) and $H_2O_2$ (hydrogen peroxide).

In the polishing step S25, the protective oxide film 23 is removed by being polished and the surface of the polycrystalline silicon layer 22 is polished to be flat as shown in FIG. 2(h). As a polishing method, a known method such as chemical mechanical polishing (CMP) is suitably usable.

In the polishing step S25, the polishing is performed so that the thickness of the polycrystalline silicon layer 22 is in a range from 1.5 μm to 2.0 μm. Furthermore, in the polishing step S25, the polishing is performed so that a root-mean-square roughness Rq of the polished polycrystalline silicon layer 22, which is measured in an area of 10 μm×10 μm, is 0.5 nm or less. The thickness of the polycrystalline silicon layer 22 is measured at nine points within a plane of the handle wafer. The nine measurement points are a center point of the handle wafer; vertices of a square inscribed in a circle that is concentric with the handle wafer and has a radius half of that of the handle wafer; and vertices of a square inscribed in a circle that is concentric with the handle wafer and is located 6 mm inside an outer circumferential edge of the handle wafer.

Here, in performing the polishing step S25, since the polycrystalline silicon layer 22 is covered by the protective oxide film 23, impurities (e.g., slurry residues) caused by the polishing apparatus do not adhere on the polycrystalline silicon layer 22. Thus, the polycrystalline silicon layer 22 is not eroded by the impurities.

In the pre-bonding cleaning step S26, particles on the polished surface of the polycrystalline silicon layer 22 are removed.

The handle wafer 24 for the bonded wafer is produced through the above steps. It should be noted that the active wafer production step S1 (S11 to S14) and the handle wafer production step S2 (S21 to S26) may be performed in parallel.

Next, the bonded wafer production step S3 for bonding the active wafer 13 and the handle wafer 24 to produce the bonded wafer will be described below.

The bonded wafer production step S3 includes a bonding step S31, a peeling heat treatment step S32, and a bonding heat treatment step S33.

In the bonding step S31, the polished surface of the polycrystalline silicon layer 22 of the handle wafer 24 and the active wafer 13 are bonded through the insulation film 11 as shown in FIG. 2(i). At this time, the active wafer 13 and the handle wafer 24 are bonded so that an implantation surface of the active wafer 13 faces the polycrystalline silicon layer 22.

In the peeling heat treatment step S32, the ion implantation layer 12 is subjected to heat treatment (peeling heat treatment) for generating microbubbles to peel the ion implantation layer 12 with the generated microbubbles. The bonded wafer 30, in which the insulation film 11 and an active layer 31 are formed on the handle wafer 24, is thus produced as shown in FIG. 2(j). It should be noted that a peeled wafer 40 having a peeling surface 41 is also produced.

In the bonding heat treatment step S33, the bonded wafer 30 is subjected to bonding heat treatment to enhance the bonding strength at the bonding interface.

The bonded wafer 30 can be produced as described above.

In the handle wafer 24 used in the above production method of the bonded wafer, the root-mean-square roughness Rq of the polished surface of the polycrystalline silicon layer 22, which is measured in an area of 10 μm×10 μm, is nm or less. Further, the number of pits of 2 nm or more in the surface of the polycrystalline silicon layer 22 of the handle wafer 24 is 1 piece/cm 2 or less. The pits are detected in the DIC mode of SP-1 produced by KLA-Tencor Corporation.

According to the handle wafer production step S2 of the above exemplary embodiment, the polycrystalline silicon layer 22 is not eroded by impurities in performing the polishing step S25. Accordingly, the formation of pits caused by the impurities can be inhibited and thus the generation of void defects due to the pits after the handle wafer is bonded to the active wafer can be inhibited.

In the protective oxide film formation step S24 of the above exemplary embodiment, the protective oxide film 23 is formed through SC-1 cleaning but may be formed through any other method. For instance, the protective oxide film 23 may be formed through ozone passivation.

In the protective oxide film formation step S24 using ozone passivation, the deposited polycrystalline silicon layer 22 is exposed to high-density ozone at normal temperature without being subjected to heat treatment, thereby forming the protective oxide film 23 on the surface of the polycrystalline silicon layer 22. By this operation, the dense protective oxide film 23 can be formed on the polycrystalline silicon layer 22.

Further, a method of forming the protective oxide film 23 in the protective oxide film formation step S24 is not limited as long as the thickness of the protective oxide film 23 falls within a range from 0.5 nm to 10 nm. Specifically, the protective oxide film 23 may be a native oxide film, thermal oxide film, deposited oxide film, or the like.

EXAMPLES

Next, the invention will be described in more detail below with reference to Examples. However, it should be noted that the scope of the invention is by no means limited by these Examples.

In order to examine the effect of the protective oxide film of the invention, a handle wafer in which a polycrystalline silicon layer was deposited and then polished without forming thereon a protective oxide film (Comparative) was compared with a handle wafer in which a polycrystalline silicon layer was deposited, then a protective oxide film was formed thereon and the resultant layer and film were polished (Examples 1 and 2), regarding the number of pits after the polishing.

Comparative

A polycrystalline silicon layer was deposited on the handle wafer body and then polished without forming thereon a protective oxide film, thereby producing a handle wafer.

Example 1

A polycrystalline silicon layer was deposited on the handle wafer body, then a protective oxide film was formed thereon through SC-1 cleaning and subsequently the resultant layer and film were polished, thereby producing a handle wafer.

Example 2

A polycrystalline silicon layer was deposited on the handle wafer body, then a protective oxide film was formed thereon through ozone passivation and subsequently the resultant layer and film were polished, thereby producing a handle wafer.

The handle wafers of Comparative and Examples 1 and 2 were produced by the same method except for the presence or absence of the protective oxide film and/or the method of forming the protective oxide film.

Table 1 shows comparison among Comparative and Examples 1 and 2 regarding the average number of pits on the polycrystalline silicon layer. The number of pits refers to the number of pits of 2 nm or more detected in the DIC mode of SP-1 produced by KLA-Tencor Corporation. The measurement was performed on a plurality of handle wafers in each of Comparative and Examples 1 and 2. Table 1 shows the respective average numbers thereof.

TABLE 1

|  | Comparative | Example 1 | Example 2 |
|---|---|---|---|
| Average Number of Pits (pieces/cm$^2$) | 1.14 | 0.39 | 0.49 |

As is clear from Table 1, Comparative has an average number of pits of 1.14 pieces/cm$^2$, whereas Examples 1 and 2 both have an average number of pits of 1 piece/cm$^2$ or less as Example 1 in which the protective oxide film was formed through SC-1 cleaning has an average number of pits of 0.39 pieces/cm$^2$ and Example 2 in which the protective oxide film was formed through ozone passivation has an average number of pits of 0.49 pieces/cm$^2$.

The invention claimed is:

1. A producing method of a handle wafer for a bonded wafer produced by bonding an active wafer and the handle wafer through an insulation film, the method comprising:
    preparing a handle wafer body made from a monocrystalline silicon wafer;
    forming an oxide film on the handle wafer body;
    depositing a polycrystalline silicon layer on the oxide film;
    forming a protective oxide film on a surface of the polycrystalline silicon layer through SC-1 cleaning of the polycrystalline silicon layer; and
    polishing to remove the protective oxide film and polishing the polycrystalline silicon layer.

2. The production method of a handle wafer for a bonded wafer according to claim 1, wherein the protective oxide film formed in the forming the protective oxide film has a thickness in a range from 0.5 nm to 10 nm.

3. A producing method of a handle wafer for a bonded wafer produced by bonding an active wafer and the handle wafer through an insulation film, the method comprising:
    preparing a handle wafer body made from a monocrystalline silicon wafer;
    forming an oxide film on the handle wafer body;
    depositing a polycrystalline silicon layer on the oxide film;
    forming, on a surface of the polycrystalline silicon layer, a protective oxide film having a thickness in a range from 0.5 nm to 10 nm; and
    polishing to remove the protective oxide film and polishing the polycrystalline silicon layer.

4. The production method of a handle wafer for a bonded wafer according to claim 3, wherein in the forming the protective oxide film, the protective oxide film is formed through SC-1 cleaning.

5. The production method of a handle wafer for a bonded wafer according to claim 3, wherein in the forming the protective oxide film, the protective oxide film is formed through ozone passivation.

* * * * *